(12) United States Patent
Mizushima et al.

(10) Patent No.: US 8,343,691 B2
(45) Date of Patent: *Jan. 1, 2013

(54) HOLOGRAM RECORDING MATERIAL AND HOLOGRAM RECORDING MEDIUM

(75) Inventors: Tetsuro Mizushima, Moriguchi (JP); Jiro Yoshinari, Tokyo (JP); Takuya Tsukagoshi, Sagamihara (JP); Hideaki Miura, Tokyo (JP); Hideki Sunohara, Tokyo (JP); Rie Ihara, Tokyo (JP)

(73) Assignee: TDK Corporation, Tokyo (JP)

( * ) Notice: Subject to any disclaimer, the term of this patent is extended or adjusted under 35 U.S.C. 154(b) by 1125 days.

This patent is subject to a terminal disclaimer.

(21) Appl. No.: 11/579,536

(22) PCT Filed: Apr. 25, 2005

(86) PCT No.: PCT/JP2005/008315
§ 371 (c)(1),
(2), (4) Date: Nov. 3, 2006

(87) PCT Pub. No.: WO2005/109116
PCT Pub. Date: Nov. 17, 2005

(65) Prior Publication Data
US 2007/0243473 A1     Oct. 18, 2007

(30) Foreign Application Priority Data
May 11, 2004  (JP) .................................. 2004-140672

(51) Int. Cl.
*G03H 1/02* (2006.01)

(52) U.S. Cl. .......... 430/1; 430/2; 430/281.1; 430/280.1; 359/3

(58) Field of Classification Search .................. None
See application file for complete search history.

(56) References Cited

U.S. PATENT DOCUMENTS

| | | | | |
|---|---|---|---|---|
| 4,942,112 A | * | 7/1990 | Monroe et al. | 430/282.1 |
| 5,292,620 A | * | 3/1994 | Booth et al. | 430/290 |
| 6,103,454 A | | 8/2000 | Dhar et al. | |

(Continued)

FOREIGN PATENT DOCUMENTS
EP            938027       *   8/1999

(Continued)

OTHER PUBLICATIONS

Zhang et al., "polymethyl methacrylate-titania hybrid materials by sol-gel processing", J. Mat. Sci., vol. 32 pp. 1469-1472 (1997).*

(Continued)

*Primary Examiner* — Martin Angebrannt
(74) *Attorney, Agent, or Firm* — Oblon, Spivak, McClelland, Maier & Neustadt, L.L.P.

(57) ABSTRACT

The present invention provides a hologram recording material which is not required to be subjected to pre-exposure treatment at the time of recording, attains high refractive index change, high sensitivity, low scattering, environment resistance, durability, low dimensional change, and high multiplicity, and is suitable for volume hologram recording. Also, the present invention provides a hologram recording medium. A hologram recording material comprising a matrix material having a softening temperature of 50° C. or higher, and a photopolymerizable monomer which is in a liquid phase state at room temperature. The matrix material is preferably contained in an amount of 50% by weight or more and 90% by weight or less of the whole of the hologram recording material. A softening temperature of the hologram recording material is preferably 0° C. or higher.

19 Claims, 2 Drawing Sheets

U.S. PATENT DOCUMENTS

| | | | |
|---|---|---|---|
| 6,268,089 | B1 | 7/2001 | Chandross et al. |
| 6,482,551 | B1 | 11/2002 | Dhar et al. |
| 6,524,771 | B2 * | 2/2003 | Maeda et al. ............... 430/290 |
| 7,883,821 | B2 | 2/2011 | Kosuda et al. |
| 7,932,000 | B2 * | 4/2011 | Hayashida et al. ............... 430/2 |
| 7,939,221 | B2 | 5/2011 | Kosuda et al. |
| 8,021,800 | B2 * | 9/2011 | Kosuda et al. ............... 430/2 |
| 8,080,348 | B2 * | 12/2011 | Hayashida et al. ............... 430/1 |
| 2002/0110740 | A1 * | 8/2002 | Otaki et al. ............... 430/1 |
| 2003/0044691 | A1 * | 3/2003 | Setthachayanon et al. ....... 430/1 |
| 2003/0064303 | A1 * | 4/2003 | Nishimura et al. ............ 430/11 |
| 2005/0036179 | A1 * | 2/2005 | Chisholm et al. ............... 359/3 |
| 2005/0231773 | A1 | 10/2005 | Sasa et al. |
| 2006/0172203 | A1 * | 8/2006 | Mizushima ............... 430/1 |
| 2007/0111107 | A1 * | 5/2007 | Yoshinari et al. ............... 430/1 |
| 2007/0111108 | A1 * | 5/2007 | Hayashida et al. ............... 430/1 |
| 2007/0243474 | A1 | 10/2007 | Mizushima et al. |
| 2008/0057404 | A1 * | 3/2008 | Kosuda et al. ............... 430/2 |
| 2008/0057405 | A1 * | 3/2008 | Yoshinari et al. ............... 430/2 |
| 2008/0057406 | A1 * | 3/2008 | Hayashida et al. ............... 430/2 |
| 2008/0076033 | A1 * | 3/2008 | Hayashida et al. ............... 430/2 |
| 2008/0160421 | A1 | 7/2008 | Hayashida et al. |
| 2008/0254375 | A1 | 10/2008 | Hayashida et al. |
| 2008/0268349 | A1 | 10/2008 | Kosuda et al. |
| 2009/0091810 | A1 | 4/2009 | Yoshinari et al. |
| 2009/0092904 | A1 | 4/2009 | Hayashida et al. |
| 2009/0097085 | A1 | 4/2009 | Hayashida et al. |
| 2009/0186281 | A1 | 7/2009 | Kosuda et al. |
| 2010/0086859 | A1 | 4/2010 | Hayashida et al. |

FOREIGN PATENT DOCUMENTS

| | | |
|---|---|---|
| JP | 2 3082 | 1/1990 |
| JP | 3 50588 | 3/1991 |
| JP | 8 101627 | 4/1996 |
| JP | 8-262700 | 10/1996 |
| JP | 11 512847 | 11/1999 |
| JP | 11-344917 | 12/1999 |
| JP | 11-352303 | 12/1999 |
| JP | 2001 235856 | 8/2001 |
| JP | 2004/017141 A1 | 2/2004 |

OTHER PUBLICATIONS

Luo et al. "Anhydrous sol-gel synthesis of titania dopd siloxane polymer for intergrated optics", J. Sol-Gel Sci. & Technol. vol. 32 pp. 297-301 (2004).*

Luo et al. "synthesis of photosensitive organic-inorganic hybrid polymers via anhydrous sol-gel process for integrated optics". Mat. Res. Soc. Symp. Proc. vol. 780 pp. 169-174 (2003).*

ISGSbulletin (2003) 15 pages.*

Schmidt et al. "Chemistry and applications of inorganic-organic polymers (organically modified silicates)", Mat. Res. Soc. Symp. Proc. vol. 73 pp. 739-750 (1986).*

Book of abstracts SOLGEL2003 368 pages (2003).*

U.S. Appl. No. 11/579,821, filed Nov. 7, 2006, Mizushima, et al.

U.S. Appl. No. 11/556,835, filed Nov. 6, 2006, Hayashida, et al.

U.S. Appl. No. 11/556,813, filed Nov. 6, 2006, Yoshinari, et al.

U.S. Appl. No. 11/953,325, filed Dec. 10, 2007, Kosuda, et al.

U.S. Appl. No. 11/964,464, filed Dec. 26, 2007, Hayashida, et al.

U.S. Appl. No. 12/021,686, filed Jan. 29, 2008, Kosuda, et al.

U.S. Appl. No. 12/061,971, filed Apr. 3, 2008, Hayashida, et al.

U.S. Appl. No. 12/109,000, filed Apr. 24, 2008, Kosuda, et al.

U.S. Appl. No. 11/847,730, filed Aug. 30, 2007, Kosuda, et al.

U.S. Appl. No. 11/847,831, filed Aug. 30, 2007, Hayashida, et al.

U.S. Appl. No. 11/847,819, filed Aug. 30, 2007, Yoshinari, et al.

U.S. Appl. No. 11/859,992, filed Sep. 24, 2007, Hayashida et al.

T. Shimura, "Holographic Memory" O Plus E, vol. 25, pp. 385-390, 2003.

U.S. Appl. No. 12/236,123, filed Sep. 23, 2008, Yoshinari, et al.

U.S. Appl. No. 12/243,077, filed Oct. 1, 2008, Hayashida, et al.

U.S. Appl. No. 12/235,958, filed Sep. 23, 2008, Hayashida, et al.

U.S. Appl. No. 12/556,965, filed Sep. 10, 2009, Hayashida, et al.

* cited by examiner

HOLOGRAM RECORDING MATERIAL AND HOLOGRAM RECORDING MEDIUM

TECHNICAL FIELD

The present invention relates to a hologram recording material suitable for volume hologram recording, and a hologram recording medium comprising the hologram recording material.

BACKGROUND ART

Research and development of holographic memories have been advanced as large-capacity recording technique making high-speed transmission possible. O plus E, vol. 25, No. 4, 385-390 (2003) describes basic structures of holographic memories and a coming prospect thereof.

Examples of the property required for a hologram recording material include high refractive index change at the time of recording, high sensitivity, low scattering, environment resistance, durability, low dimensional change, and high multiplicity. As a hologram recording material, there is known a photopolymer material made mainly of an organic binder polymer and a photopolymerizable monomer.

For example, JP-A-11-512847 discloses a volume hologram recording medium comprising an acid generator capable of generating an acid when the generator is exposed to chemical ray radiation; a binder; and at least one monomer or oligomer capable of undergoing cationic polymerization which is initiated with the acid generated from the acid generator. As the binder, a siloxane polymer or oligomer, or an acrylate is disclosed.

JP-A-8-101627 discloses a photosensitive composition for volume hologram recording, comprising (a) a glycidyl group-containing compound wherein the remaining chlorine content by percentage is 1% or less by weight, (b) a radical polymerizable compound, (c) a radical photopolymerization initiator which is sensitized to a laser beam or a light good in coherency to polymerize the component (b), and (d) a cationic polymerization initiator.

The hologram recording materials described in the both publications are each in a liquid form and are required to be subjected to pre-exposure treatment at time of hologram recording; at the initial stage of exposure, recording cannot be attained. In other words, when each of the recording materials is in a liquid phase so as to have fluidity, interference bands generated by light interference are not kept in the position thereof; therefore, it is necessary to subject the material to exposure treatment in advance to decrease the fluidity. Additionally, when the hologram recording material is in a liquid form, there is caused a problem that after the formation of a recording medium the recording material leaks out from the medium.

DISCLOSURE OF THE INVENTION

Objects of the Invention

Thus, an object of the present invention is to provide a hologram recording material which is not required to be subjected to pre-exposure treatment at the time of recording, attains high refractive index change, high sensitivity, low scattering, environment resistance, durability, low dimensional change, and high multiplicity, and is suitable for volume hologram recording. Another object of the present invention is to provide a hologram recording medium comprising the hologram recording material.

SUMMARY OF THE INVENTION

The present invention comprises the followings:

(1) A hologram recording material comprising a matrix material having a softening temperature of 50° C. or higher, and a photopolymerizable monomer which is in a liquid phase state at room temperature. The room temperature means a temperature range from 20° C. to 30° C., for example, 20° C.

(2) The hologram recording material according to (1), wherein the matrix material is contained in an amount of 50% by weight or more and 90% by weight or less of the whole of the hologram recording material.

(3) The hologram recording material according to (1) or (2), wherein a softening temperature of the hologram recording material is 0° C. or higher.

(4) The hologram recording material according to any one of (1) to (3), wherein the matrix material comprises an organometallic compound which at least contains at least two kinds of metals, oxygen, and an aromatic group, and has an organometallic unit wherein two aromatic groups are bonded directly to one metal, and which has a softening temperature of 50° C. or higher.

(5) The hologram recording material according to any one of (1) to (4), wherein one of the at least two kinds of metal is Si, the metal(s) other than Si is/are selected from the group consisting of Ti, Zr, Ge, Sn, Al and Zn, and Si and the metal(s) other than Si are bonded through the oxygen atom.

(6) The hologram recording material according to any one of (1) to (5), wherein the organometallic unit is a unit wherein two aromatic groups are bonded directly to one Si atom.

(7) The hologram recording material according to any one of (1) to (6), further comprising a photopolymerization initiator.

(8) A hologram recording medium comprising the hologram recording material according to any one of (1) to (7).

In the present invention, the softening temperature is a temperature when a thermomechanical analysis (TMA) apparatus is used to insert an indenter ($\phi$: 3 mm) to which a constant load of 14 kPa (0.1N) is applied into a material the temperature of which is raised at a constant rate (3° C./min). At this time, the temperature of the indenter is also raised. More details of the measuring conditions are as described in Examples.

According to the present invention, there is provided a hologram recording material which comprises a matrix material having a softening temperature of 50° C. or higher and a photopolymerizable monomer that is in a liquid phase state at room temperature, is not required to be subjected to pre-exposure treatment at the time of recording, attains high refractive index change and high sensitivity, and is suitable for volume hologram recording medium. The hologram recording material of the present invention is used to provide a hologram recording medium having a recording film thickness of 100 μm or more, which is suitable for data storage.

MODES FOR CARRYING OUT THE INVENTION

The hologram recording material of the present invention comprises a composition comprising, as essential components, a matrix material having a softening temperature of 50° C. or higher, and a photopolymerizable monomer which is in a liquid phase state at room temperature. The recording material exhibits good recording property in an ordinary operating environment (0° C. to 50° C.).

When light having coherency is irradiated onto this hologram recording material made into a film form, the photopolymerizable monomer undergoes polymerization reaction in the exposed portion so as to be polymerized, and further the photopolymerizable monomer diffuses and shifts from the unexposed portion into the exposed portion so that the polymerization of the exposed portion further advances. As a result, an area where the polymer produced from the photopolymerizable monomer is large in amount and an area where the polymer is small in amount are formed in accordance with the intensity distribution of the light. At this time, the matrix material shifts from the area where the polymer is large in amount to the area where the polymer is small in amount, so that the area where the polymer is large in amount becomes an area where the matrix material is small in amount and the area where the polymer is small in amount becomes an area where the matrix material is large in amount. In this way, the exposure causes the formation of the area where the polymer is large in amount and the area where the matrix material is large in amount. When a refractive index difference exists between the polymer and the matrix material, a refractive index change is recorded in accordance with the light intensity distribution.

In the present invention, the matrix material, which has a softening temperature of 50° C. or higher, is contained, whereby interference bands recorded in the operating environment (0° C. to 50° C.) do not flow at ease from the recorded positions inside the hologram recording material. As a result, hologram recording can be attained without conducting any pre-exposure treatment nor allowing the hologram recording material into a still state. In the present invention, the softening temperature of the matrix material is preferably lower than 200° C. It is necessary that the matrix material shifts with the photopolymerization of the photopolymerizable monomer, thereby forming a concentration gradient, in order to improve the hologram recording property. In the case of the matrix material having a softening temperature of 200° C. or higher to have a rigid structure, this shift is not easily caused to result in deterioration in the recording property. The photopolymerizable monomer is easily photopolymerized to attain high-sensitivity recording since the monomer is in a liquid phase state at the operating environment (0° C. to 50° C.).

In the present invention, the matrix material is contained preferably in an amount of 50% by weight or more and 90% by weight or less of the whole of the hologram recording material (as nonvolatile contents), more preferably in an amount of 60% by weight or more and 85% by weight or less thereof. If the amount of the matrix material is less than 50% by weight, the effect of restraining the fluidity of the recorded interference bands inside the recording material becomes weak. If the amount of the matrix material is more than 90% by weight, the content of the photopolymerizable monomer becomes too small so that sufficient refractive index change cannot be obtained.

In the present invention, the softening temperature of the whole of the hologram recording material is preferably 0° C. or high and lower than 150° C. in a state before hologram recording. When the matrix material is contained in an amount of 50% by weight or more and 90% by weight or less of the whole of the hologram recording material, the hologram recording material can be rendered a hologram recording material having a softening temperature of 0° C. or higher. If the softening temperature is lower than 0° C., the amount of the matrix material is small so that the effect of restraining the fluidity of the interference bands recorded in the above-mentioned operating environment (0° C. to 50° C.) inside the recording material becomes weak.

In order to obtain a better recording property in the hologram recording material, it is necessary that a difference is large between the refractive index of the polymer produced from the photopolymerizable monomer and that of the matrix material. The refractive indexes of the polymer and the matrix material may be designed so as to make any one of the refractive indexes high (or low).

The matrix material used in the present invention is preferably a matrix material comprising an organometallic compound which at least contains at least two kinds of metals, oxygen, and an aromatic group, has an organometallic unit wherein two aromatic groups are bonded directly to one metal, and has a softening temperature of 50° C. or higher and lower than 200° C. In the case of using such a matrix material, it is advisable to design the hologram recording material to make the refractive index of the matrix material high and make the refractive index of the polymer low, since the aromatic groups are introduced into the matrix material so that the matrix material has high refractive index.

The organometallic compound at least contains at least two kinds of metals (M), oxygen, and an aromatic group (Ar), and has an organometallic unit (Ar-M-Ar) wherein two aromatic groups (Ar) are bonded directly to one metal (M). The metals (M) are bonded to each other through the oxygen atom. About the metals (M), two or more kinds of metals are arbitrarily selected from the group consisting of, for example, Si, Ti, Zr, Ge, Sn, Al and Zn. Only one kind of the selected two or more kinds of metals may constitute the organometallic unit, or the other kinds of metal(s) may also constitute the organometallic unit(s) of one or more different kinds. When the organometallic compound contains the two or more kinds of metals as its constituting metals, the characteristics such as refractive index are easily controlled so that the recording material is easily designed.

The organometallic compound is produced by hydrolysis and polymerization reaction, what is called sol-gel reaction, using alkoxide compounds of the corresponding two or more kinds of metals (M) and diarylalkoxide compounds of the metals (M) constituting the organometallic unit.

In the organometallic compound, it is preferred that one of the at least two kinds of metals (M) is Si and the metal(s) other than Si is/are arbitrarily one or more kind(s) selected from the group consisting of Ti, Zr, Ge, Sn, Al and Zn. Si and the metal(s) other than Si are bonded to each other through one or more oxygen atoms.

In the organometallic compound, it is preferred that the organometallic unit (Ar-M-Ar) is a unit (Ar-Si-Ar) wherein two aromatic groups are bonded directly to one Si atom. About the diarylalkoxide compound of Si, raw materials are available at ease. However, it is not excluded that aromatic groups are bonded directly to the metal other than Si.

In the organometallic compound, it is more preferred that the organometallic unit (Ar-M-Ar) is a unit (Ph-Si-Ph) wherein two phenyl groups (Ph) are bonded directly to one Si atom. About the diphenylalkoxide compound of Si, raw materials are available at ease, and the compound is good in reactivity for hydrolysis and polymerization. The phenyl groups may have a substituent.

The organometallic compound has an organometallic unit wherein two aromatic groups are bonded directly to one metal. Besides the organometallic unit, the organometallic compound may have an organometallic unit wherein one aromatic group is bonded directly to one metal, or may have an organometallic unit wherein three aromatic groups are bonded directly to one metal.

According to the introduction of the two aromatic groups (phenyl groups) into Si, the organometallic compound has good compatibility with the photopolymerizable monomer described below and an organic polymer produced by the polymerization thereof. The refractive index of the organometallic compound also becomes high.

In order to make the organometallic compound so as to have high refractive index, it is preferred to use Ti as the metal other than Si.

Preferred examples of the organometallic compound in the present invention include (I) and (II) represented by the following chemical formulae. In the examples, the alkoxide of Si is methoxide, and the alkoxide of Ti is butoxide. It is evident that other alkoxides are also allowable.

These organometallic compounds can each be obtained by performing hydrolysis and polymerization reaction using a diphenylalkoxide compound of Si and an alkoxide compound of Ti. For example, the reaction equation in the case of using diphenyldimethoxysilane as the diphenylalkoxide compound of Si and a titanium butoxide oligomer as the alkoxide compound of Ti is represented by the following chemical formulae. The alkoxides of the both starting materials are hydrolyzed and then polymerized so that Si and Ti are bonded to each other through an oxygen atom. As a result, there can be obtained the organometallic compound containing Si and Ti as constituting metals, including diphenylsilane units, and having various molecular weights. In the chemical formulae, (I) and (II) are illustrated as examples of the organometallic compounds. That is, the organometallic compound is obtained in the form of a composition of organometallic compound variations having various molecular weights. This composition would include such compounds as a silane compound (III) containing no Ti.

(II)
n = 5
Mw = ca. 1,600

(III)
Mw = ca. 400

In the present invention, it is preferred that the number (p) of the phenyl groups, the number (s) of the Si atoms, and the number (m) of the metals other than Si which are contained in the organometallic compound satisfy the following relationship in the above-mentioned organometallic compound composition:

$s \leq p < 3s$, and $0.3s \leq m \leq 3s$.

Specifically, it is preferred that one or more and less than three phenyl groups are bonded to one Si atom, as the whole of the organometallic compound composition, from the viewpoint of the compatibility with the photopolymerizable compound and an organic polymer obtained by the polymerization thereof. It is also preferred that the number (m) of the metals other than Si, such as Ti, is within the above-mentioned range in relative to the number (s) of the Si atoms. If the number (m) of the other metals is less than 0.3s, the effects of the inclusion of the two or more kinds of metals into the organometallic compound, that is, the effect that the characteristics, such as the refractive index, are easily controlled becomes small. On the other hand, if the number (m) of the other metals is more than 3s, the organometallic compound comes to have the nature of an inorganic matrix easily as the whole of the compound so that the compatibility or flexibility falls.

In the present invention, an organic group other than the aromatic groups, for example, an alkyl group may be introduced into Si in the organometallic compound. For example, methylphenyldimethoxysilane or the like can be used as long as the advantageous effects of the present invention are not damaged. When a monoalkoxysilane such as trimethylmethoxysilane is present, the polymerization reaction is terminated. Accordingly, the monoalkoxysilane can be used to adjust the molecular weight.

The organometallic compound may contain trace amounts of elements other than the above.

In the present invention, the photopolymerizable monomer is a monomer which can be photopolymerized. As the photopolymerizable monomer, a compound selected from a radical polymerizable compound and a cation polymerizable compound can be used.

The radical polymerizable compound is not particularly limited as long as the compound has in the molecule one or more radical polymerizable unsaturated double bonds. For example, a compound having a (meth)acryloyl group or a vinyl group can be used.

Examples of the compound having a (meth)acryloyl group out of such radical polymerizable compounds include phenoxyethyl (meth)acrylate, trimethylolpropane tri(meth)acrylate, pentaerythritol tetra(meth)acrylate, dipentaerythritol hexa(meth)acrylate, diethylene glycol di(meth)acrylate, triethylene glycol di(meth)acrylate, tetraethylene glycol di(meth)acrylate, polyethylene glycol di(meth)acrylate, bis(2-hydroxyethyl)isocyanurate di(meth)acrylate, 2,2-bis[4-(acryloxy-diethoxy)phenyl]propane, and the like. However, the compound having a (meth)acryloyl group is not necessarily limited thereto.

Examples of the compound having a vinyl group include divinylbenzene, ethylene glycol divinyl ether, diethylene glycol divinyl ether, triethylene glycol divinyl ether, and the like. However, the compound having a vinyl group is not necessarily limited thereto.

One kind of the radical polymerizable compound may be used, and two or more kinds thereof are used together. In the case of making the refractive index of the organometallic compound high and making the refractive index of the organic polymer low, in the present invention, a compound having no aromatic group to have low refractive index (for example, refractive index of 1.5 or less) is preferred out of the above-mentioned radial polymerizable compounds. In order to make the compatibility with the organometallic compound better, preferred is a more hydrophilic glycol derivative such as polyethylene glycol di(meth)acrylate.

The cation polymerizable compound is not particularly limited about the structure as long as the compound has at least one reactive group selected from a cyclic ether group and a vinyl ether group.

Examples of the compound having a cyclic ether group out of such cation polymerizable compounds include compounds having an epoxy group, an alicyclic epoxy group or an oxetanyl group.

Specific examples of the compound having an epoxy group include bisphenol A diglycidyl ether, Novolak type epoxy resins, trisphenolmethane triglycidyl ether, 1,4-butanediol diglycidyl ether, 1,6-hexanediol diglycidyl ether, glycerin triglycidyl ether, trimethylolpronane triglycidyl ether, propylene glycol diglycidyl ether, polyethylene glycol diglycidyl ether, and the like.

Specific examples of the compound having an alicyclic epoxy group include 2,4-epoxycyclohexylmethyl-3,4-epoxycyclohaxane carboxylate, bis(3,4-epoxycyclohexylmethyl)adipate, 2-(3,4-epoxycyclohexyl-5,5-spiro-3,4-epoxy) cyclohexanone-meta-dioxane, bis(2,3-epoxycyclopentyl) ether, EHPE-3150 (alicyclic epoxy resin, manufactured by Dicel Chemical Industries, Ltd.), and the like.

Specific examples of the compound having an oxetanyl group include 1,4-bis[(3-ethyl-3-oxetanylmethoxy)methyl] benzene, 1,3-bis[(3-ethyl-3-oxetanylmethoxy)methyl]propane, ethylene glycol bis(3-ethyl-3-oxetanylmethyl) ether, trimethylolpropane tris(3-ethyl-3-oxetanylmethyl) ether, pentaerythritoltetrakis(3-ethyl-3-oxetanylmethyl) ether, dipentaerythritol hexakis(3-ethyl-3-oxetanylmethyl) ether, ethylene oxide modified bisphenol A bis(3-ethyl-3-oxetanylmethyl) ether, and the like.

Specific examples of the compound having a vinyl ether group, out of the cation polymerizable compounds, include triethylene glycol divinyl ether, tetraethylene glycol divinyl ether, trimethylolpropane trivinyl ether, cyclohexane-1,4-dimethylol divinyl ether, 1,4-butanediol divinyl ether, polyester divinyl ether, polyurethane polyvinyl ether, and the like.

One kind of the cation polymerizable compound may be used, or two or more kinds thereof may be used together. As the photopolymerizable compound, an oligomer of the cation polymerizable compounds exemplified above may be used. In the case of making the refractive index of the organometallic compound high and making the refractive index of the organic polymer low, in the present invention, a compound having no aromatic group to have low refractive index (for example, refractive index of 1.5 or less) is preferred out of the above-mentioned cation polymerizable compounds. In order to make the compatibility with the organometallic compound better, preferred is a more hydrophilic glycol derivative such as polyethylene glycol diglycidyl ether.

In the present invention, it is advisable to use the photopolymerizable monomer in an amount of, for example, about 10 to 50% by weight, preferably in an amount of 15 to 40% by weight of the whole of the hologram recording material (as a nonvolatile component). If the amount is less than 10% by weight, large refractive index change is not easily obtained at the time of recording. If the amount is more than 50% by weight, large refractive index change is not easily obtained, either, at the time of recording.

In the present invention, it is preferred that the hologram recording material further contains a photopolymerization initiator corresponding to the wavelength of recording light. When the photopolymerization initiator is contained in the hologram recording material, the polymerization of the photopolymerizable monomer is promoted by the exposure of light at the time of recording. Consequently, a higher sensitivity is achieved.

When a radical polymerizable compound is used as the photopolymerizable monomer, a photo radical initiator is used. On the other hand, when a cation polymerizable compound is used as the photopolymerizable monomer, a photo cation initiator is used.

Examples of the photo radical initiator include Darocure 1173, Irgacure 784, Irgacure 651, Irgacure 184 and Irgacure 907 (each manufactured by Ciba Specialty Chemicals Inc.). The content of the photo radical initiator is, for example, about 0.1 to 10% by weight, preferably about 0.5 to 5% by weight on the basis of the radical polymerizable compound.

As the photo cation initiator, for example, an onium salt such as a diazonium salt, a sulfonium salt, or a iodonium salt can be used. It is particularly preferred to use an aromatic onium salt. Besides, an iron-arene complex such as a ferrocene derivative, an arylsilanol-aluminum complex, or the like can be preferably used. It is advisable to select an appropriate initiator from these. Specific examples of the photo cation initiator include Cyracure UVI-6970, Cyracure UVI-6974 and Cyracure UVI-6990 (each manufactured by Dow Chemical Co. in USA), Irgacure 264 and Irgacure 250 (each manufactured by Ciba Specialty Chemicals Inc.), and CIT-1682 (manufactured by Nippon Soda Co., Ltd.). The content of the photo cation initiator is, for example, about 0.1 to 10% by weight, preferably about 0.5 to 5% by weight on the basis of the cation polymerizable compound.

It is preferred that the photopolymerization initiator contains a dye or the like that functions as a sensitizer corresponding to the wavelength of recording light besides the initiator.

It is preferred that the photopolymerization initiator is decomposed in order to stabilize hologram recording after the recording. Usually, the initiator is decomposed by sufficient irradiation of light after the recording.

The following will describe the production of the hologram recording material.

The hologram recording material of the present invention may be obtained by dissolving the matrix material and the photopolymerizable monomer into respective appropriate solvents to prepare solutions, mixing the resultant both solutions, and drying the solvents after the mixing. The matrix material may be formed by mixing a starting material of the matrix material with the photopolymerizable monomer and conducting polymerization reaction after the mixing to give a softening temperature of 50° C. or higher.

The hologram recording material may be obtained by dispersing the photopolymerizable monomer into the matrix material preferably at the stage of forming the matrix material by a sol-gel process or the like.

In the case of the preferred matrix material comprising the above-mentioned organometallic compound, the production of the hologram recording material will be described hereinafter.

First, the above-mentioned organometallic compound is prepared by hydrolysis and polymerization reaction such as a sol-gel process or the like. For example, a diphenylalkoxide compound of Si and an alkoxide compound of Ti are used as starting materials, and the both starting materials are subjected to hydrolysis and polymerization reaction, thereby yielding a composition of the organometallic compound containing Si and Ti as constituting metals, including diphenylsilane units, and having various molecular weights.

The hydrolysis and polymerization reaction can be carried out according to almost the same operations and conditions as in known sol-gel processes. For example, the metal alkoxide compounds (the diphenylalkoxide compound of Si and the alkoxide compound of Ti), as the starting materials, the ratio therebetween being the determined ratio, are dissolved into an appropriate good solvent to prepare a homogeneous solution. An appropriate acid catalyst is dropped into the solution. The solution is stirred in the presence of water, whereby the reaction can be conducted.

Examples of such a solvent include: water; alcohols such as methanol, ethanol, propanol, isopropanol, and butanol; ethers such as diethyl ether, dioxane, dimethoxyethane and tetrahydrofuran; and N-methylpyrrolidone, acetonitrile, dimethylformamide, dimethylacetoamide, dimethylsulfoxide, acetone, benzene, and the like. The solvent may be appropriately selected from these. Alternatively, a mixture of these may be used. The amount of the solvent is not limited, and is preferably 10 to 1000 parts by weight with respect to 100 parts by weight of the whole of the metal alkoxide compound.

Examples of the acid catalyst include: inorganic acids such as hydrochloric acid, sulfuric acid, nitric acid and phosphoric acid; organic acids such as formic acid, acetic acid, trichloroacetic acid, trifluoroacetic acid, propionic acid, methanesulfonic acid, ethanesulfonic acid, and p-toluenesulfonic acid; and the like.

The hydrolysis polymerization reaction can be generally conducted at room temperature, which depends on the reactivity of the metal alkoxide compounds. The reaction can be conducted at a temperature of about 0 to 150° C., preferably at a temperature of about room temperature to 50° C. The reaction time may be appropriately determined, correspondingly to the relationship with the reaction temperature. The time is about 0.1 to 240 hours. The reaction may be conducted in an inert atmosphere such as nitrogen gas, or may be conducted under a reduced pressure of about 0.5 to 1 atom while the alcohol produced by the polymerization reaction is removed.

Before or after the hydrolysis, the photopolymerizable monomer is mixed. The photopolymerizable monomer may be mixed with the metal alkoxide compounds as the starting materials after or before the hydrolysis. In the case of the mixing after the hydrolysis, it is preferred to add and mix the photopolymerizable monomer in the state that the sol-gel reaction system containing the organometallic compound is sol in order to perform the mixing uniformly. The mixing of a photopolymerization initiator can also be conducted before or after the hydrolysis.

A hologram recording material solution is obtained wherein the photopolymerizable organic compound and the sol-state organometallic compound are uniformly mixed. The hologram recording material solution is applied onto a substrate, and then the drying of the solvent and sol-gel reaction are advanced, thereby yielding a film-form hologram recording material. In such a way, the hologram recording material is produced wherein the photopolymerizable organic compound is uniformly contained in the specific organometallic compound.

In a preferred embodiment of the present invention, since the organometallic compound, which has an organometallic unit wherein two aromatic groups are bonded directly to one metal, is used as a matrix, that is, a dispersing medium for the photopolymerizable monomer, the organometallic compound is very good in compatibility with the photopolymerizable monomer at any stage in the production of the above-mentioned hologram recording material. In other words, the compatibility between the sol-state organometallic compound and the photopolymerizable monomer is very good, and the compatibility between the cured organometallic compound and the photopolymerizable monomer is also very good. The hologram recording material of the present invention is also good in flexibility. For the reasons, the material can be applied to a hologram recording medium in various forms. Furthermore, the organometallic compound contains two or more kinds of metals as constituting metals, whereby the characteristics such as refractive index are easily controlled and thus the recording material is easily designed.

When the hologram recording material of the present invention is used, a hologram recording medium having a recording layer thickness of 100 µm or more, which is suitable for data storage, can be obtained. The hologram recording medium can be produced by forming the hologram recording material in a film form onto a substrate, or sandwiching the hologram recording material in a film form between substrates. It is preferred to use, for the substrate(s), a material transparent to a recording/reproducing wavelength, such as glass or resin. It is preferred to form an anti-reflection film against the recording/reproducing wavelength for preventing noises or give address signals and so on onto the substrate surface at the side opposite to the layer of the hologram recording material. In order to prevent interface reflection, which results in noises, it is preferred that the refractive index of the hologram recording material and that of the substrate are substantially equal to each other. It is allowable to form, between the hologram recording material layer and the substrate, a refractive index adjusting layer comprising a resin material or oil material having a refractive index substantially equal to that of the recording material or the substrate. In order to keep the thickness of the hologram recording material layer between the substrates, a spacer suitable for the thickness between the substrates may be arranged. End faces of the recording material medium are preferably subjected to treatment for sealing the recording material.

Since the matrix material having a softening temperature of 50° C. or higher according to the hologram recording medium of the present invention is used, the material is in a gel form at an ordinary recording environment (0° C. to 50° C.) not to exhibit fluidity; therefore, no pre-exposure treatment is necessary at the time of recording. Since its recording film is uniform, a problem of light scattering is not caused. Furthermore, in a preferred embodiment of the present invention, an organometallic compound having an organometallic unit wherein two aromatic groups are bonded directly to one metal is used as the matrix, that is, the dispersing medium for a photopolymerizable monomer. Therefore, in the exposed portion at the time of recording, the photopolymerizable monomer is made into a polymer; the organometallic compound and the polymer are very good in compatibility with each other since the organometallic compound has the plural aromatic groups. Therefore, according to the hologram recording medium of the present invention, the compatibility is sufficiently kept and problems of light scattering and a fall in the transmittance are not caused when or after recording is performed.

EXAMPLES

The present invention will be more specifically described by way of the following examples. However, the present invention is not limited to these examples.

Example 1

Diphenyldimethoxysilane and a titanium butoxide oligomer represented by the following structural formula were used to produce a hologram recording material in accordance with steps described below by a sol-gel process.

k = 10

(Synthesis of Matrix Material)

In 40 mL of a solvent of tetrahydrofuran, 7.8 g of diphenyldimethoxysilane and 7.2 g of a titanium butoxide oligomer (B-10, manufactured by Nippon Soda Co., Ltd.) were mixed to prepare an alkoxide solution. The mole ratio of Si to Ti was 1:1.

A solution of 2.1 mL of water, 0.3 mL of a 1N hydrochloric acid solution in water, and 5 mL of tetrahydrofuran was dropped into the alkoxide solution at room temperature while the solution was stirred. Stirring was continued for 2 hours to conduct hydrolysis reaction. In this way, there was obtained a sol solution A of an organometallic compound comprising Si, Ti and phenyl groups at the following mole ratio:

Si:Ti:phenyl groups=1:1:2 (mole ratio).

(Photopolymerizable Monomer)

As a photopolymerizable monomer, a polyethylene glycol diacrylate (M-245, manufactured by Toagosei Co., Ltd.) was used. This photopolymerizable monomer was liquid at room temperature, and had a viscosity of 60 mPa·s. 3 parts by weight of an IRG-784 (Ciba Specialty Chemicals) as a photopolymerization initiator were added to 100 parts by weight of the polyethylene glycol diacrylate, and then they were mixed.

(Hologram Recording Material Solution; Insertion of Photopolymerizable Monomer)

The sol solution A and the photopolymerizable monomer were mixed at room temperature to set the percentage of the matrix material (as a nonvolatile component) and that of the photopolymerizable monomer into 67% by weight of the whole of the hologram recording material and 33% by weight thereof, respectively, thereby yielding a yellow transparent hologram recording material solution B.

(Hologram Recording Material)

Figure 1:
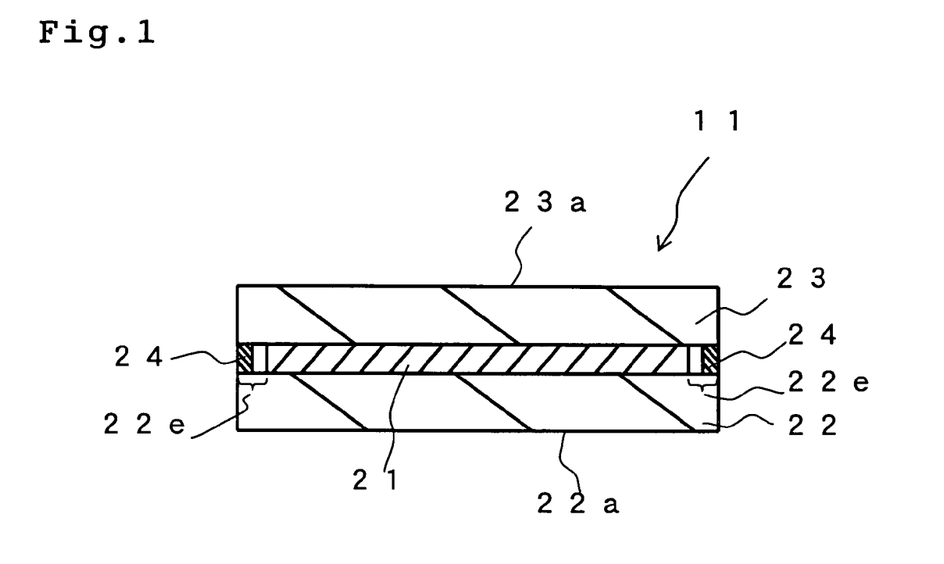
FIG. 1 is a view illustrating a schematic section of a hologram recording medium produced in examples.

Description is made with reference to FIG. 1 illustrating a schematic sectional view of a hologram recording medium.

A glass substrate (22) having one surface on which an anti-reflection film (22a) was formed was prepared. The resultant hologram recording material solution B was applied onto the surface of the glass substrate (22) where the anti-reflection film (22a) was not formed except an end portion (22e) of the substrate, so as to give a dry film thickness of 100 µm. The resultant was dried at 50° C. for 24 hours to volatilize the solvent. Through this drying step, the gelation (polymerization reaction) of the matrix material was advanced to yield a hologram recording material layer (21) wherein the matrix material and the photopolymerizable monomer were uniformly dispersed.

(Hologram Recording Medium)

A spacer (24) of 100 µm thickness was put on the end portion (22e) of the glass substrate (22) on which the hologram recording material layer (21) was formed, and then the hologram recording material layer (21) was covered with another glass substrate (23) on one surface of which an anti-reflection film (23a) was formed. At this time, the covering was performed to bring the surface of the glass substrate (23) on which the anti-reflection film (23a) was not formed into contact with the surface of the hologram recording material layer (21). This manner gave a hologram recording medium (11) having a structure that the hologram recording material layer (21) was sandwiched between the two glass substrates (22) and (23).

(Measurement of Softening Temperature)

The sol solution A of the matrix material was applied onto a glass substrate for softening temperature measurement to give a dry thickness of 100 µm, and then dried at 50° C. for 24 hours. The solvent was volatilized to attain gelation. In this way, a layer made only of the matrix material was yielded.

A thermomechanical analysis (TMA) apparatus (TMA-2940, manufactured by TA Instruments) was used to measure the softening temperature of the layer made only of the matrix material under the following conditions.

Figure 2:
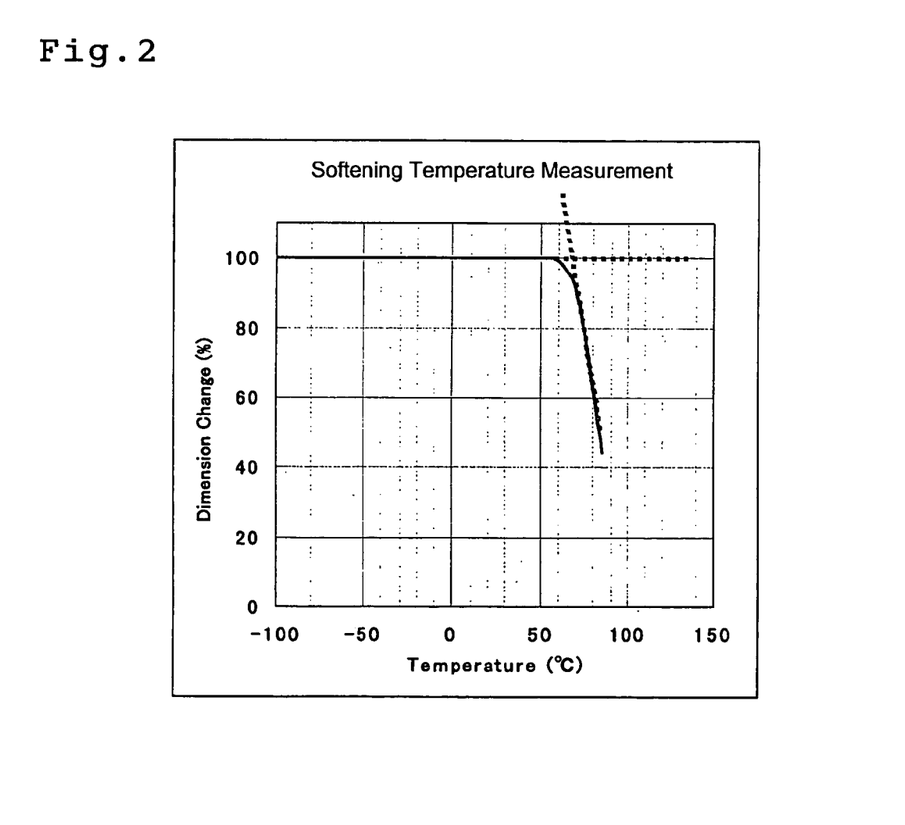
FIG. 2 is a graph showing data processing when softening temperature is measured, and is a graph showing dimension change (%) as a function of measurement temperature (° C.) change.

Measuring Conditions:
Temperature-raising rate: 3° C./min
Load: 14 kPa (0.1 N)
Indenter ($\phi$: 3 mm)
Measurement from −100° C. in the atmosphere of nitrogen gas From the measurement results, a low temperature portion and a high temperature portion of the thermal distortion curve corresponding to the inserted depth of the indenter were approximated to two linear lines, and the temperature at the intersection point of the two linear lines was defined as the softening temperature (° C.). FIG. 2 is a graph showing data processing at this time, and is a graph showing thermal distortion (Dimension Change (%)) as a function of measurement temperature (Temperature (° C.)) change. The thermal distortion is the thickness of the layer made only of the matrix material relative to the standard thickness of the layer at the initial stage when the indenter was not inserted (at −100° C.). The softening temperature of the layer made only of the matrix material was 68° C.

Similarly, the resultant hologram recording material solution was applied onto the glass substrate for softening temperature measurement to give a dry film thickness of 100 µm, and then dried at 50° C. for 24 hours. The solvent was volatilized to attain gelation. In this way, a hologram recording material layer wherein the matrix material and the photopolymerizable monomer were uniformly mixed with each other was yielded. Under the above-mentioned conditions as described above, a measurement was made. As a result, the softening temperature of the hologram recording material layer was 13° C.

(Characteristic Evaluation)

Figure 3:
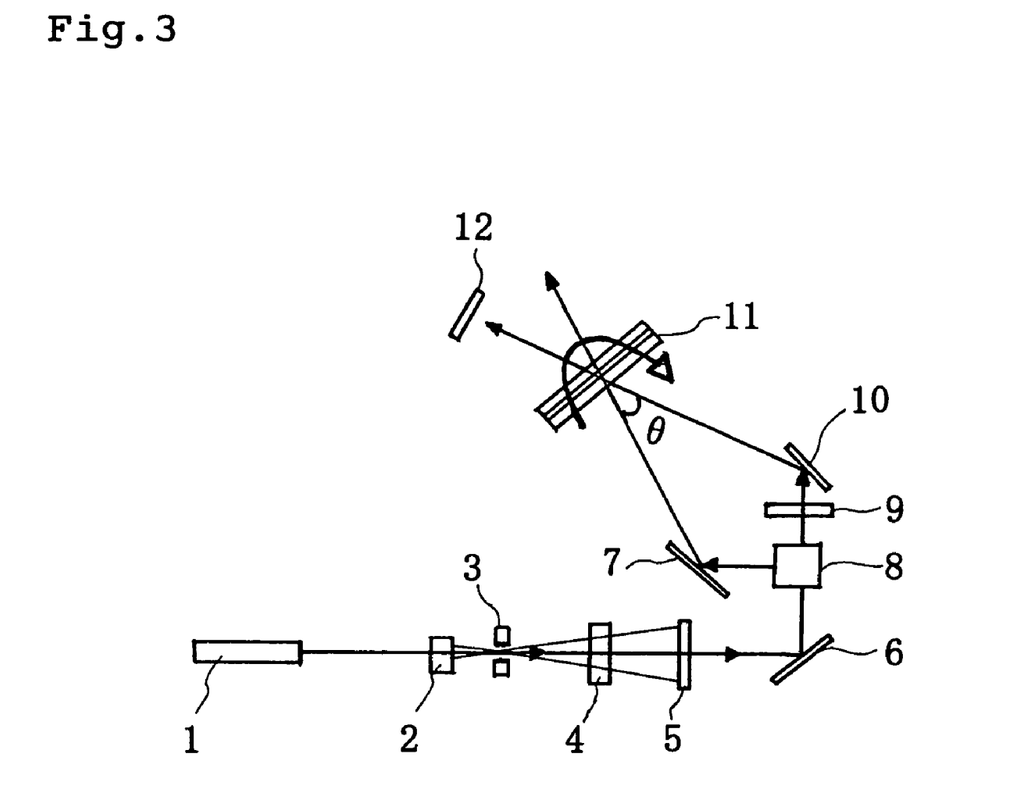
FIG. 3 is a view illustrating the outline of a hologram recording optical system used in the examples.

About the resultant hologram recording medium sample, characteristics were evaluated in a hologram recording optical system as illustrated in FIG. 3.

In the hologram recording optical system in FIG. 3, a light source (1) of Nd:YAG laser (532 nm) was used, and light oscillated from the light source (1) was spatially filtered and collimated through a lens (2), a pin hole (3), a shutter (4) and a lens (5). The light was split with a beam splitter (8) to set the total incident angle θ of the two luminous fluxes to the hologram recording medium sample (11) into 53.1°. The interference of the two luminous fluxes was recorded with the sample (11). The sample (11) was rotated in the horizontal direction to do the angle multiplexing, thereby recording a hologram (sample angle: −24° to +24°, angle interval: 3°, and 17-piece multiplicity). After the recording of the hologram, only one luminous flux was sufficiently irradiated thereto in order to cause the remaining unreacted components to react. About reproduction, a shutter (9) was used to irradiate only one luminous flux thereto, and the diffraction efficiency was measured with a power meter (12) while the sample (11) was rotated. In FIG. 3, reference numerals (6), (7) and (10) denote mirrors.

About the hologram recording medium sample of Example 1, recording was able to be attained without conducting any pre-exposure treatment, and the obtained initial recording sensitivity was also as high a value as 0.005 [M#/(mJ/cm$^2$)]. The refractive index change Δn calculated from the dynamic range: M# (the sum of square roots of diffraction efficiencies) was also as high a value as 0.009.

Example 2

A hologram recording material was yielded by conducting the very same operations as in Example 1 except that the ratio of the matrix material (as a nonvolatile component) was set to 46% by weight of the whole of the hologram recording material. Furthermore, a hologram recording medium was produced.

The softening temperature of the hologram recording material layer was −16° C.

About the hologram recording medium sample of Example 2, recording was able to be attained without conducting any pre-exposure treatment, but the initial recording sensitivity was 0.002 [M#/(mJ/cm$^2$)], which was a lower value than that of the sample of Example 1.

Comparative Example 1

In Comparative Example 1, a phenylmethylsilicone oil (refractive index n=1.58, and softening temperature: −15° C. or lower), which was liquid at room temperature, was used as a matrix material. As a photopolymerizable monomer and a photopolymerization initiator, the same as used in Example 1 were used.

The matrix material, the photopolymerizable monomer and the photopolymerization initiator were mixed at room temperature to set the ratio of the phenylmethylsilicone oil, which was the matrix material, to 67% by weight of the whole of the hologram recording material. In this way, a hologram recording material was yielded.

There was prepared a glass substrate (22) having one surface on which an anti-reflection film (22a) was formed. An enclosure was arranged on the surface of the glass substrate (22) on which the anti-reflection film (22a) was not formed. The resultant hologram recording material was poured to the inside of the enclosure to give a thickness of 100 μm. The hologram recording material was a liquid material having fluidity. The upper of the hologram recording material layer (21) was sealed with another glass substrate (23) having one surface on which an anti-reflection film (23a) was formed so as to interpose a spacer (24) of 100 μm in thickness. At this time, the covering was performed to bring the surface of the glass substrate (23) on which the anti-reflection film (23a) was not formed into contact with the surface of the recording material layer (21). In this hologram recording medium, recording was unable to be attained unless pre-exposure treatment was conducted.

The invention claimed is:

1. A hologram recording material comprising a matrix material having a softening temperature of 50° C. or higher, and a photopolymerizable monomer which is in a liquid phase state at room temperature,
    wherein the matrix material comprises an organometallic compound comprising at least two different metals, oxygen, and an aromatic group, and having an organometallic unit wherein two aromatic groups are bonded directly to one metal, which organometallic compound is obtained from starting compounds excluding compounds having an ethylenically unsaturated double bond.

2. The hologram recording material according to claim 1, wherein the matrix material is contained in an amount of 50% by weight or more and 90% by weight or less of the whole of the hologram recording material.

3. A hologram recording medium comprising the hologram recording material according to claim 2 on a substrate.

4. The hologram recording material according to claim 1, wherein a softening temperature of the hologram recording material is 0° C. or higher.

5. A hologram recording medium comprising the hologram recording material according to claim 4 on a substrate.

6. The hologram recording material according to claim 1, wherein one of the at least two different metals is Si, and the metal or metals other than Si is at least one metal selected from the group consisting of Ti, Zr, Ge, Sn, Al and Zn, and Si and the metal or metals other than Si are bonded through the oxygen atom.

7. A hologram recording medium comprising the hologram recording material according to claim 6 on a substrate.

8. The hologram recording material according to claim 1, wherein the organometallic unit is a unit wherein two aromatic groups are bonded directly to one Si atom.

9. A hologram recording medium comprising the hologram recording material according to claim 8 on a substrate.

10. The hologram recording material according to claim 1, further comprising a photopolymerization initiator.

11. A hologram recording medium comprising the hologram recording material according to claim 10 on a substrate.

12. A hologram recording medium comprising the hologram recording material according to claim 1 on a substrate.

13. The hologram recording material according to claim 1, wherein the organometallic compound is obtained by a hydrolysis and polymerization reaction of components comprising a diaromatic alkoxide of at least a first metal and a monomeric or oligomeric alkoxide of at least a second metal different from said first metal.

14. The hologram recording material according to claim 13, wherein the at least first metal is Si and the at least second metal is Ti.

15. The hologram recording material according to claim 14, wherein the organometallic compound includes a compound represented by the following formula:

wherein n is an integer.

16. The hologram recording material according to claim 14, wherein the organometallic compound includes a compound represented by the following formula:

wherein n is an integer.

17. The hologram recording material according to claim 1, wherein the photopolymerizable compound is a radical polymerizable compound or a cation polymerizable compound.

18. The hologram recording material according to claim 17, wherein the photopolymerizable compound is a radical polymerizable compound comprising at least one (meth) acryloyl group or at least one vinyl group.

19. The hologram recording material according to claim 17, wherein the photopolymerizable compound is a cation polymerizable compound comprising at least one reactive cyclic ether group or at least one reactive vinyl ether group.

* * * * *